United States Patent
Kaji et al.

(10) Patent No.: US 6,754,395 B1
(45) Date of Patent: Jun. 22, 2004

(54) IMAGE INFORMATION ENCODING METHOD AND DECODING METHOD

(75) Inventors: Toshiyuki Kaji, Tokyo (JP); Masahiro Ishiyama, Tokyo (JP)

(73) Assignee: Kabushiki Kaisha Sega Enterprises, Tokyo (JP)

( * ) Notice: Subject to any disclaimer, the term of this patent is extended or adjusted under 35 U.S.C. 154(b) by 0 days.

(21) Appl. No.: 09/674,306
(22) PCT Filed: Dec. 14, 1999
(86) PCT No.: PCT/JP99/07015
§ 371 (c)(1),
(2), (4) Date: Oct. 31, 2000
(87) PCT Pub. No.: WO00/52937
PCT Pub. Date: Sep. 8, 2000

(30) Foreign Application Priority Data

Mar. 4, 1999 (JP) .......................................... 11-057032

(51) Int. Cl.[7] ................................................ G06K 9/36
(52) U.S. Cl. ...................................................... 382/246
(58) Field of Search ................................ 382/232–240, 382/242, 248, 250; 341/63, 65, 67, 106; 375/240.02–240.03, 240.12–240.16, 240.18, 240.2, 240.22–240.25

(56) References Cited

U.S. PATENT DOCUMENTS 5,227,875 A * 7/1993 Suu et al. ............... 375/240.25
5,600,812 A * 2/1997 Park ........................... 711/200
5,673,042 A   9/1997 Yoshida et al.
5,764,804 A * 6/1998 Yajima et al. ............... 382/238
6,121,903 A * 9/2000 Kalkstein ...................... 341/63
6,188,338 B1 * 2/2001 Yokose .......................... 341/65

FOREIGN PATENT DOCUMENTS

| GB | 2267410 | 12/1993 |
| JP | 6-44038 | 2/1994 |
| JP | 8-18981 | 1/1998 |
| JP | 10-022835 | 1/1998 |

OTHER PUBLICATIONS

J.A. Storer and T.G. Syzmanski, "Data Compression via Textual Substitution," Journal of the Assoc. for Computing Machinery, Oct. 1982, vol. 29, No. 4, pp. 928–951.
International Search Report, Mar. 7, 2000.

* cited by examiner

Primary Examiner—Jose L. Couso
(74) Attorney, Agent, or Firm—Finnegan, Henderson, Farabow, Garrett & Dunner, L.L.P.

(57) ABSTRACT

In the present invention, the appearance frequency of all image information items to be encoded is determined, short code words are allocated from predetermined code words in accordance with leaves of a bifurcating scheme to image information items having an appearance frequency up to a predetermined ranking, in sequential fashion starting from the image information item having the highest appearance frequency, and a predetermined identifier is appended to the beginning of each of the remaining image information items, the resulting codes being taken as the respective code words allocated to said remaining image information items. Thereby, it is possible to provide an image information encoding method whereby decoding by hardware can be performed readily.

10 Claims, 6 Drawing Sheets

(A)

(B)

(C)

(D)

IMAGE INFORMATION ENCODING METHOD AND DECODING METHOD

TECHNICAL FIELD

The present invention relates to encoding and decoding techniques for image information, and more particularly, to encoding and decoding techniques for image information whereby Haffman encoding is improved.

BACKGROUND ART

The Haffman encoding technique is known as one type of encoding (compression) and decoding technique for image information. This encoding technique compresses image information by assigning short code words to information having a high frequency of appearance (high occurrence probability) within image information that is to be compressed, and assigning long code words to information having a low frequency of appearance.

However, according to this technique, since a bifurcating scheme is determined for allocating the code words when calculating the appearance frequency of all of the image information to be compressed, the bifurcating scheme differs according to the respective image information. In other words, the structure of the bifurcating scheme is not uniform. When the compressed image information is decoded by hardware, the decoding circuit must be designed to correspond to the structure of the bifurcating scheme, and therefore the hardware design is extremely complex.

Moreover, when decoding image information which has been stored in a memory using this technique, it is necessary previously to read in the correspondence chart (table) for code words assigned to the image information, and since the code words are assigned to each type of image information on a one-to-one basis, the amount of data in the table is large, the table read time becomes long, and moreover, the amount of memory required also increases.

DISCLOSURE OF THE INVENTION

Therefore, it is an object of the present invention to provide an encoding method and decoding method for image information whereby image information can be compressed with good efficiency and decoded readily by hardware. Moreover, it is a further object of the present invention to provide an information storage medium which is encoded by means of the aforementioned encoding method, an image information decoding device for decoding code words recorded on the aforementioned information storage medium, and an image processing device comprising this image information decoding device.

In the image information encoding method according to the present invention, the appearance frequency of all image information items to be encoded is determined, short code words are allocated from predetermined code words in accordance with leaves of a bifurcating scheme to image information items having an appearance frequency up to a predetermined ranking, in sequential fashion starting from the image information item having the highest appearance frequency, and a predetermined identifier (header) is appended to the beginning of each of the remaining image information items, the resulting codes being taken as the respective code words allocated to the remaining image information items.

In other words, in addition to assigning short code words to image information items having a high appearance frequency, in a similar manner to a conventional Haffman encoding technique, image information items having an appearance frequency of a specified ranking or lower fare encoded by appending an identifier to the beginning of said image information items. In particular, it is desirable if the bifurcating scheme has a predetermined structure. By previously fixing the structure of the bifurcating scheme, the design of the decoding circuit is markedly simplified.

Furthermore, the identifier is set as a code word which does not match the combination pattern of any other code word. For example, it is set as a code word corresponding to any leaf of the aforementioned bifurcating scheme.

Moreover, the length of the code words allocated to the remaining image information items is uniform. By adopting this encoding method, a decode operation for the aforementioned image information can be performed readily by hardware.

Moreover, desirably, the image information items are differential values of image information between adjacent picture elements. Generally, there is a strong correlation between adjacent pixels in image information, and by deriving the differential values between pixels, it is possible to obtain image information which approximates '0' and hence the compression rate for the image information can be improved. Furthermore, image information containing colour data in RGB format, or the like, is suitable as the image information to be encoded.

The image information decoding method according to the present invention is a method for decoding image information encoded by means of the encoding method of the present invention, characterized in that, when the beginning of the code word matches the identifier, the code following the identifier, being of a code length corresponding to the information volume (for example, 8 bits) of the image information items, is decoded as the code word assigned to the image information item which is equivalent to the code, and when the beginning of the source code does not match the identifier, the source code is decoded by referring to a table of source codes assigned to each image information item.

The information storage medium according to the present invention is a computer-readable information storage medium storing image information encoded by means of the encoding method of the present invention. Here, an information storage medium is a medium on which information, principally, image information, as well as other digital data, image processing programs, and the like, is stored by physical means of some kind, and which is capable of causing prescribed functions to be executed in a computer, and in particular, a dedicated processor (for example, a video display processor), or the like. Consequently, it should be capable of downloading information to a computer by means of some kind, in order to cause prescribed functions to be implemented. Examples of such a medium include: a flexible disk (FD), hard disk (HD), CD-ROM, CD-R, DVD-ROM, DVD-RAM, DVD-R, PD disk, MD disk, MO disk, or the like.

Moreover, image information principally signifies colour data (RGB data in the case of an RGB system, and palette numbers in the case of a palette system), but also includes various image processing control information, such as transparency processing control flags, window control flags, and the like. Furthermore, this image information also includes data from which original image information (original data) can be obtained reversibly by performing prescribed calculations, such as the differential values in image information between picture elements.

The image information decoding device according to the present invention comprises: first storage means for reading out code words from the information storage medium according to the present invention, in sequential fashion, and storing same temporarily; second storage means for storing a correspondence table for the code words and corresponding image information items; and a decoding circuit which, if the beginning of the code word sequence stored in the first storage means matches the identifier, outputs the code following the identifier, being a code having a code length corresponding to the information volume of the image information items, as a decode result, and if the beginning of the code word does not match the identifier, outputs a decode result for the code word by referring to the table stored in the second storing means. This image information decoding device may be used in an image processing device, such as a video game device, or the like, for example.

REST MODE FOR CARRYING OUT THE INVENTION

In this embodiment of the present invention, the image information encoding and decoding techniques according to the present invention are applied to an image processing device, such as a video game device, or the like. This embodiment is described below with reference to the drawings.

Figure 1:
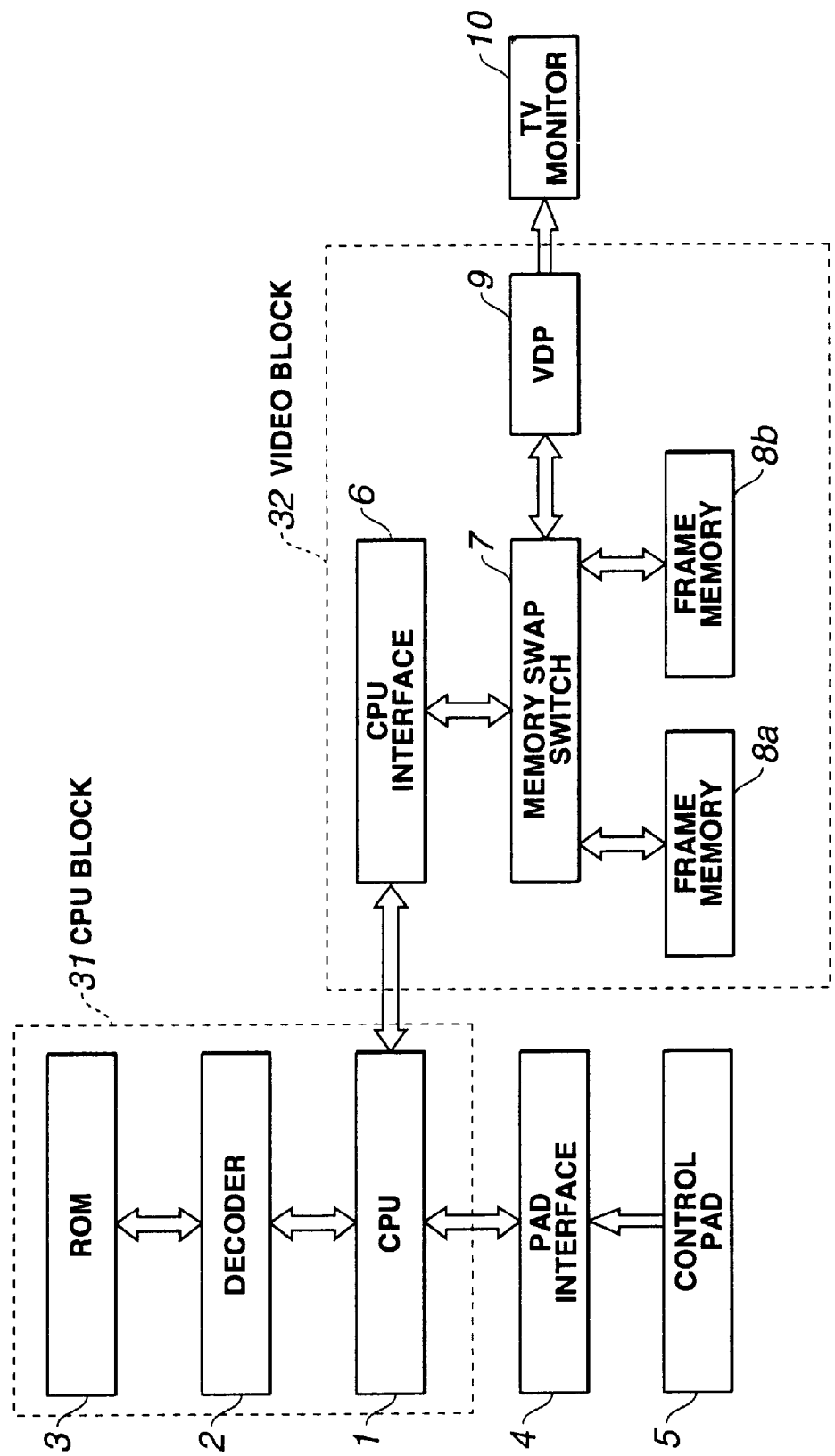
FIG. 1 is a block diagram of an image processing device.

FIG. 1 is a block diagram of an image processing device. The image processing device is principally constituted by a CPU block 31 and a video block 32. The CPU block 31 comprises a CPU 1, decoder (image information decoding device) 2 and a ROM 3. The video block 32, on the other hand, comprises a CPU interface 6, memory swap switch 7, frame memories 8a and 8b, and VDP (Video Display Processor) 9. The control pad 5 and TV monitor 10 are externally connected peripherals of the image processing device.

The ROM 3 contains a boot program which functions when the device is started up, and it also stores image information, such as background images, and the like, for display on the TV monitor 10, which have been previously encoded (compressed). In order to supply this image information to the video block 32 and perform prescribed image processing, the CPU 1 accesses the ROM 3 by means of the decoder 2. The encoded image information is supplied from the ROM 3 to the decoder 2, where it is decoded. Details of image information decode processing performed by the decoder 2 are described hereinafter.

The decoded image information (original data) is supplied via the CPU 1 and CPU interface 6 to the memory swap switch 7. Two frame memories 8a and 8b are connected to the memory swap switch 7, one being used to write image data by the VDP 9 and the other being used to read image data. The VDP 9 contains a horizontal and vertical synchronization signal generating circuit for controlling the timing at which the image data drawn to frame memory 8a or 8b is read out, a D/A converter, a video signal generating circuit, and the like, and it outputs video signals to the TV monitor 10. Furthermore, the control pad 5 is connected to the CPU 1 via a pad interface 4, in such a manner that operating signals can be input by a player, or the like.

Figure 5:
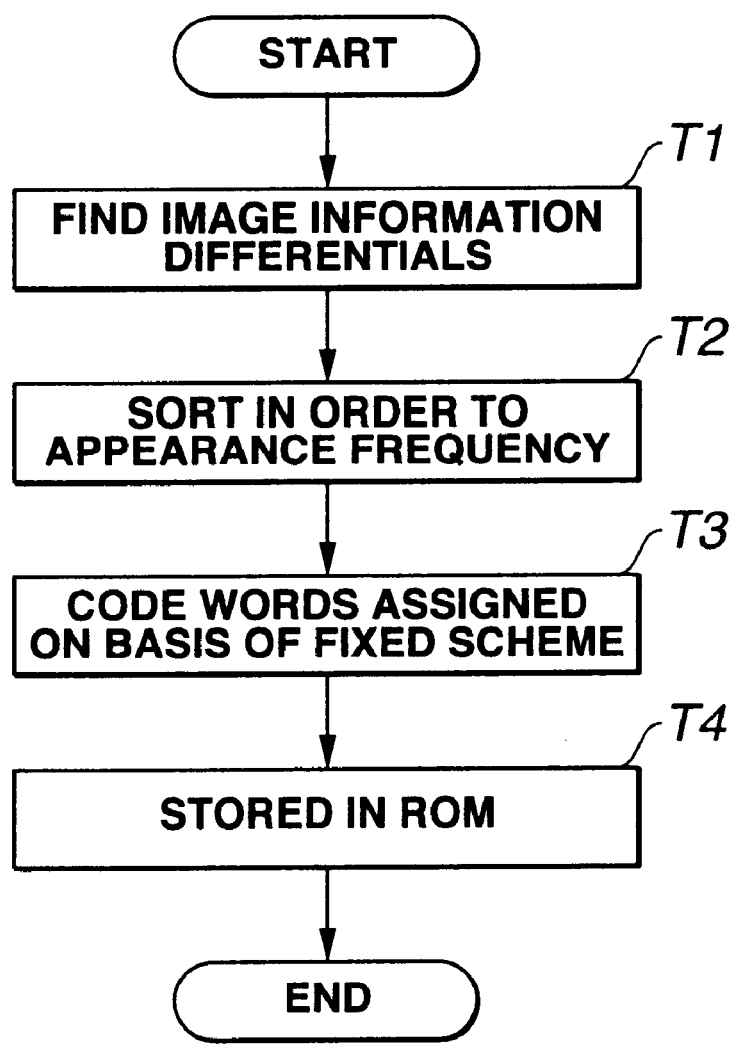
FIG. 5 is a flowchart of image information encoding steps.

Next, an overview of a procedure for encoding image information to be stored in the ROM 3 is described. FIG. 5 is a flowchart showing a procedure for encoding image information. Firstly, the differential of the image information to be stored in the ROM 3 is derived (step T1). Since there is a strong correlation between adjacent pixels in image information, in many cases, the colour is similar. Therefore, by deriving the differential of the image information (hereinafter, called 'differential data',) it is possible to obtain image information which approximates '0'. This is particularly notable in images having few colour changes and low spatial frequency, such as background images.

Once the differential data for all items of image information have been obtained, the differential data is sorted in order of appearance frequency (step T2). Thereupon, code words are assigned to the differential data in order of appearance frequency, on the basis of a bifurcating scheme having a previously determined structure (hereinafter, called 'fixed bifurcating scheme'), (step T3). This fixed bifurcating scheme is described in detail below. Finally, the relevant code words are stored in the ROM 3, along with a table of correspondences (table data) between the differential data and code words (step T4).

Figure 3:
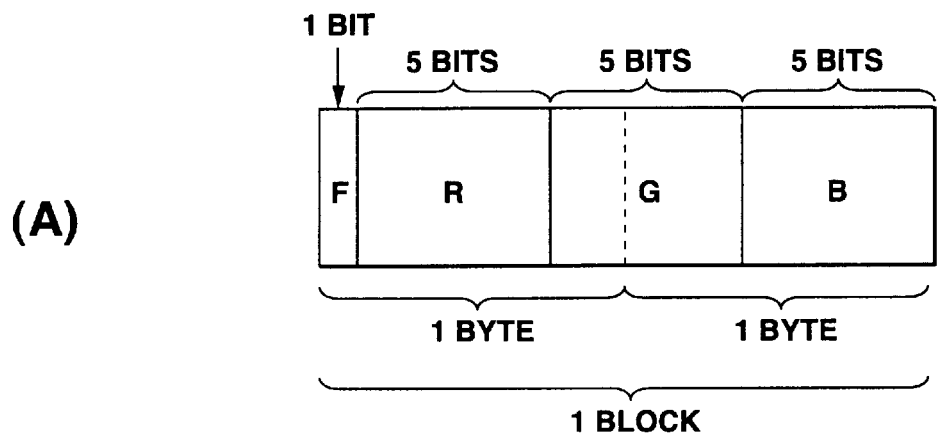
FIG. 3 is a diagram showing the data structure of image information and code words.
Figure 3:
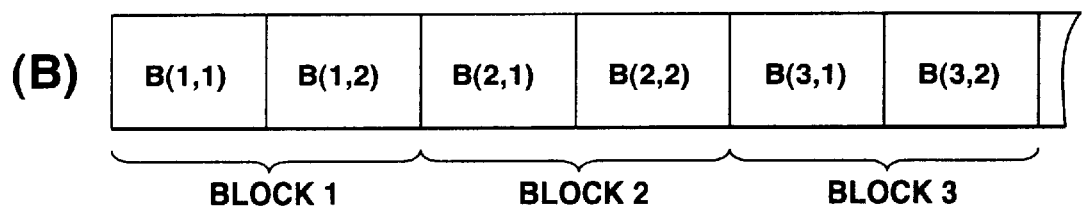
Figure 3:
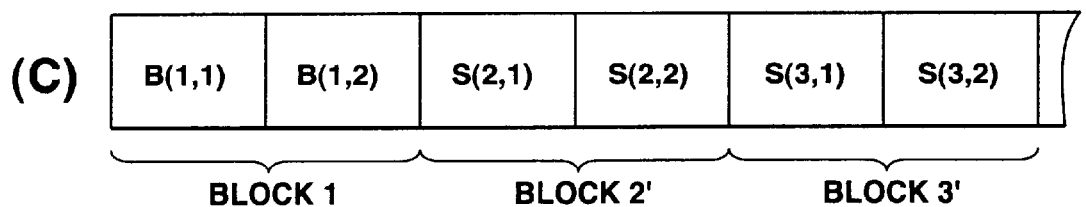
Figure 3:
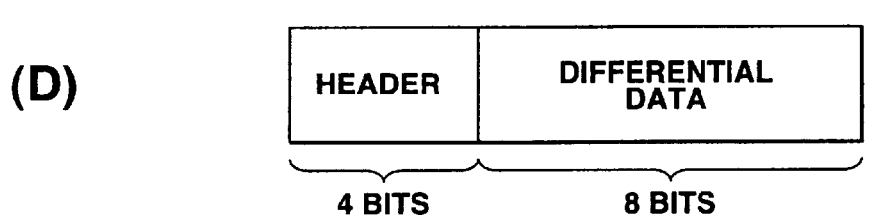

Next, the procedure for encoding image information is described in detail. FIG. 3(A) shows one example of an image information format for a single pixel in a bit-map system. In this example, 16-bit image information expressed in RGB format is treated as a single block, the most significant bit thereof being taken as a flag bit used for window control, transparency processing, and the like. The remaining 15 bits are used for R (red) data (5 bits), G (green) data (5 bits), and B (blue) data (5 bits).

FIG. 3(B) shows a data sequence of image information before encoding (original data), which is separated into block 1, block 2, block 3, . . . by dividing into respective 2-byte blocks. Moreover, each block is divided into a single upper byte and a single lower byte. For example, the image information in the upper byte of block 1 is taken as B(1,1), and the image information in the lower byte is taken as B(1,2). Similarly, the image information in the upper byte of block 2 is taken as B(2,1) and the image information in the lower byte is taken as B(2,2). The image information in the upper byte of block N is taken as B(N,1) and the image information in the lower byte is taken as B(N,2).

When finding the differentials in this image information, the differentials between the corresponding upper bytes and lower bytes of respective blocks are derived. For example, when finding the differential between block 1 and block 2, the calculation $$B(1,1)-B(2,1)=S(2,1)$$

is performed with respect to the upper bytes, and the calculation $$B(1,2)-B(2,2)=S(2,2)$$

is performed with respect to the lower bytes. Moreover, the differential data constituted by S(2,1) and S(2,2) is formed into a new block, block 2'. Thereupon, block 3', block 4', and so on, are derived by means of a similar procedure. For example, the upper byte of block N, is derived by the calculation $B(N-1,1)-B(N,1)=S(N,1)$, whilst the lower byte thereof is derived by the calculation $B(N-1,2)-B(N,2)=S(N,2)$.

The data structure for the differential data is shown in FIG. 3(C). The first header block is block 1 of the original data in an unaltered state, and from the second block onwards, the data structure comprises block 2', block 3', . . . , containing differential data.

After deriving the differentials of the image information, the differential data elements are sorted in order of frequency of appearance, and code words are assigned on the basis of the aforementioned fixed bifurcating scheme. As described previously, the fixed bifurcating scheme is a bifurcating scheme having a previously determined branching structure, for example, the bifurcating scheme illustrated in FIG. 4(A). Generally, in a bifurcating scheme, two branches extend downwards sequentially from a 'root', the ends of each branch being called a 'node'. If a further two branches extend from the 'node', then this 'node' having 'branches' is called an 'internal node', whilst a 'node' having no 'branches' is called a 'leaf'. When Haffman encoding is used, it is possible to allocate a code word for assigning to the image information to each 'leaf' of the bifurcating scheme.

Normally, when using Haffman compression, the bifurcating scheme structure is determined after calculating the data types and appearance frequency of same, but in the present invention, the structure of the bifurcating scheme is determined previously, independently of the image information. By previously determining the bifurcating scheme structure, the hardware installation of same is simplified.

Figure 4:
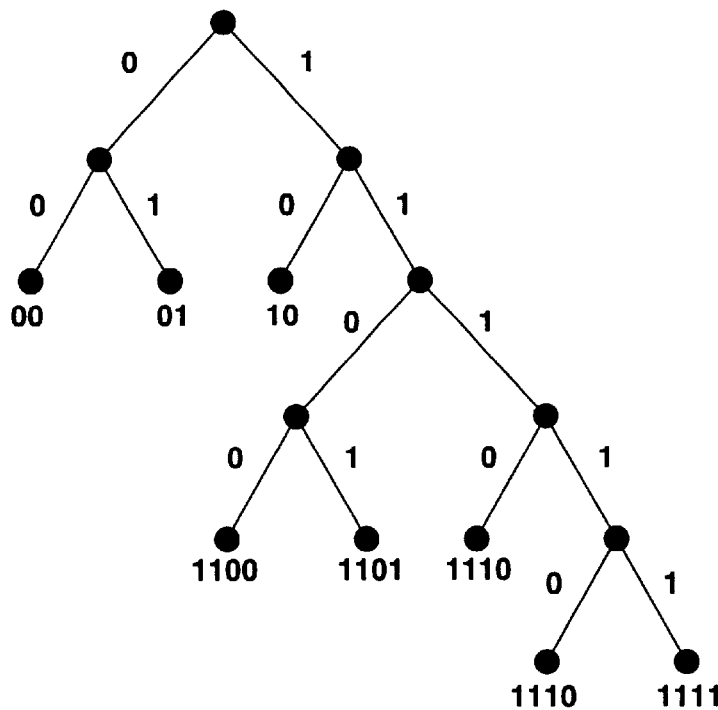
FIG. 4 is a diagram illustrating a bifurcating tree structure and a table.

The results for the appearance frequency of the differential data are as illustrated in FIG. 4(B). Here, the code word '00' is assigned to the differential data S(2,1) having an appearance frequency ranking of 1, and code word '01' is assigned to the differential data S(4,2) having appearance frequency ranking 2. Thereafter, code words are assigned to respective differential data in a similar fashion. Here, since the bifurcating scheme has a fixed structure, in the case of the present example, no code words can be assigned to differential data from the ninth appearance frequency ranking onwards.

Therefore, for the differential data having the eighth or lower appearance frequency ranking, '1110' is set as a header (identifier), and the respective differential data bits (8 bits) are appended after the header. For example, supposing that the differential data S(5,2) having the eighth appearance frequency ranking is "00100111", then the code word for the differential data S(5,2) will be "111000100111". Furthermore, supposing that the differential data S(6,1) having the ninth appearance frequency ranking is "10101100", then the code word for the differential data S(6,1) will be "111010101100". In this way, by setting the upper 4 bits as a previously fixed header and setting the lower 8 bits to the corresponding differential data, as illustrated in FIG. 3(D), it is possible to fix the length of the code words used for differential data having the eighth or lower appearance frequency ranking, to 12 bits.

Figure 2:
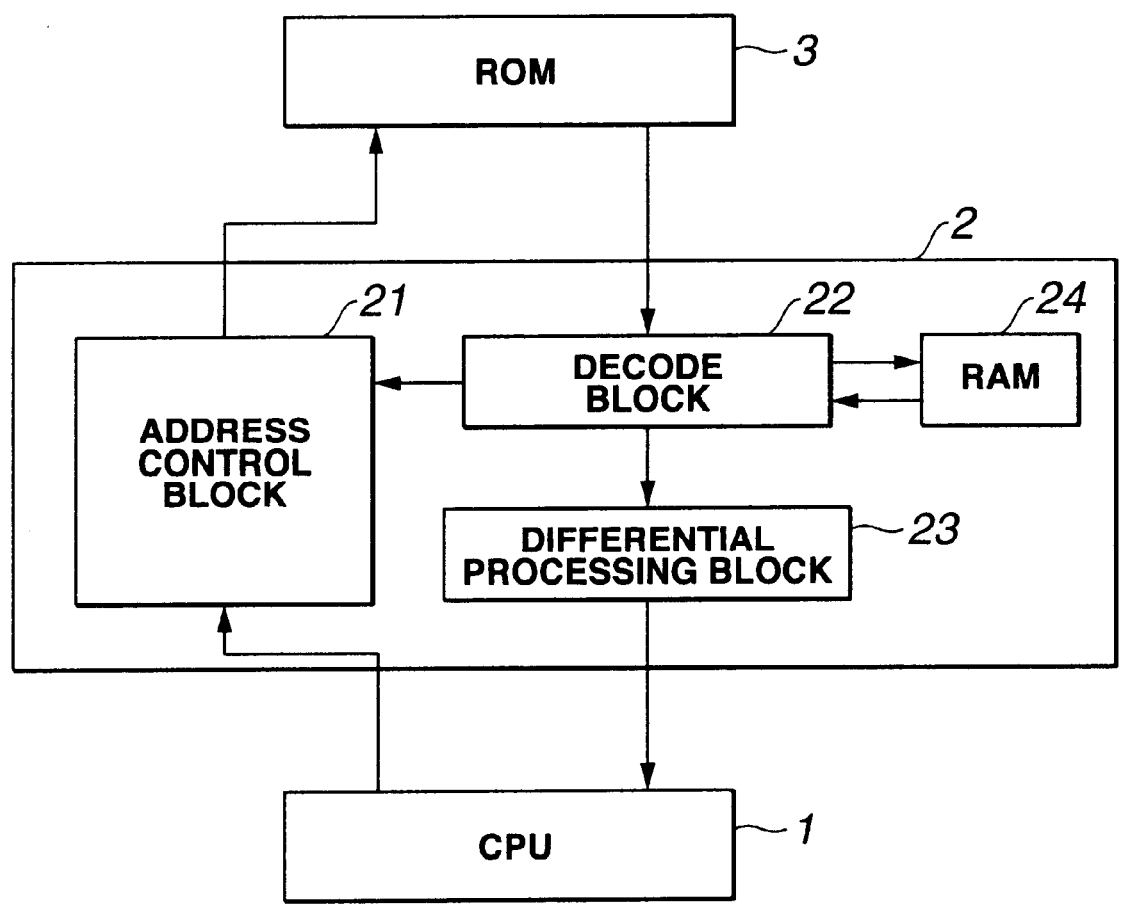
FIG. 2 is a block diagram of a decoder.

Next, an overview of a decoding procedure for image information stored in the ROM 3 is described. FIG. 2 illustrates a CPU block 31 only and omits the video block 32, and the like. The decoder 2 internally comprises an address control block 21, decode block 22, differential processing block 23 and RAM 24. When a ROM access request has been issued by the CPU 1, the address control block 21 performs a prescribed address conversion process and outputs the address of the image information in the ROM 3 that has been requested by the CPU 1. Correspondence table data for the code words and differential data are supplied from the ROM 3 via the decode block 22 to the RAM 24, and furthermore, the respective code words are supplied to the decode block 22. A plurality of shift registers are contained in the decode block 22, and the code words are decoded on the basis of the aforementioned table stored in the RAM 24. After the code words have been converted to differential data by the decode block 22, the differential data is supplied to the differential processing block 23. The differential processing block 23 comprises an adder, which performs addition processing with respect to the differential data, thereby yielding the original image information. This image information is supplied from the differential processing block 23 to the CPU 1.

Figure 6:
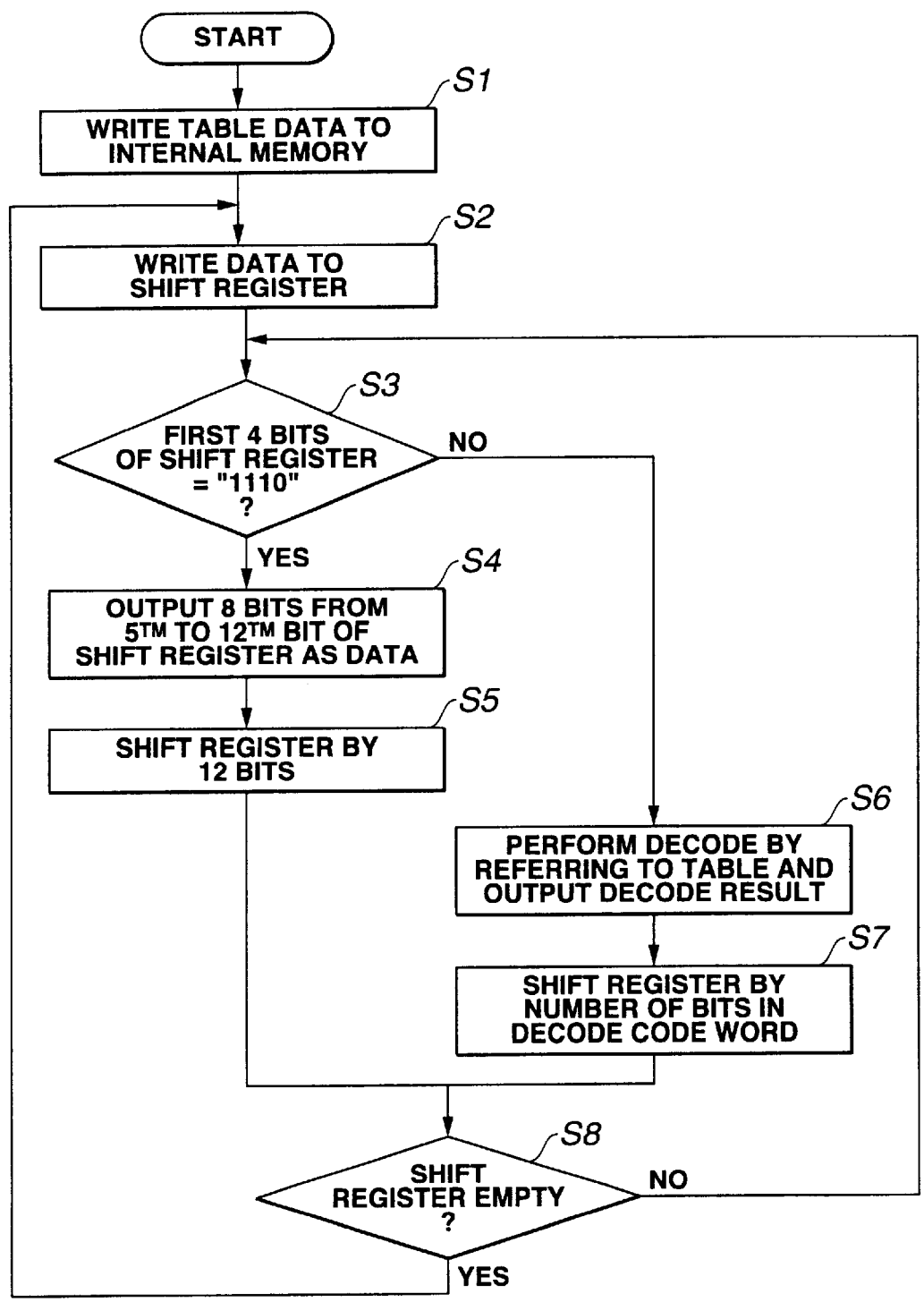
FIG. 6 is a flowchart of image information decoding steps.

Next, a procedure for decoding image information is described in detail with reference to FIG. 6. When the CPU 1 has issued an image information access request to the ROM 3, the table data is transferred from the ROM 3 via the decode block 22 and stored in the RAM 24 (step S1). This table data contains correspondence relationships for the differential data having the first to seventh appearance frequency rankings, and the corresponding code words, from the table shown in FIG. 4(B). For the differential data having the eighth or lower appearance frequency ranking, a header consisting of the bit sequence "1110" is attached as the first 4 bits of the corresponding code word, and the differential data is then inserted as the following 8 bit data sequence. Consequently, for the differential data having the eighth or lower appearance frequency ranking, provided that the first 4 bits of the code word are "11110", the corresponding differential data can be obtained by referring to the subsequent bit sequence, without having to reference the table shown in FIG. 4(B), and therefore, it is not necessary to create a table indicating the correlations between the code words and these differential data. Therefore, an information storage capacity of (8 bits (differential data information volume)×7=) 56 bits is sufficient for the table data stored in the RAM 24. Thereupon, a subsequent code word is supplied to the shift register in the decode block 22 (step S2). If the first 4 bits in the shift register are "1110" (step S3: YES), then the 8 bits from the fifth bit to the twelfth bit in the shift register are supplied to the differential processing block 23 as differential data (step S4), whereupon the contents of the shift register are shifted by 12 bits (step S5). On the other hand, if the first 4 bits in the shift register are not "1110" (step S3: NO), then the code word is decoded by referencing the table in the RAM 24, and the corresponding differential data is supplied to the differential processing block 23 (step S6). Thereupon, the contents of the shift register are shifted by the number of bits in the decoded code word (step S7).

A concrete explanation of the processing steps above is now given. Supposing that the contents of the shift register, starting from the header, are "10111101111001110111 . . . ", then since the first 4 bits do not match "1110", the decode block 22 performs decoding by referring to the table. Since the first two bits are "10", the differential data S(10,2) is identified. Therefore, the decode block 22 outputs differential data S(10,2). By shifting the contents of the shift register by 2 bits, the register contents become "11110111001110111 . . . ". The first 4 bits are now checked again and since they are not "1110", decoding is performed by referring to the table. The first 5 bits are "11110", and hence the differential data S(12,1) is identified. Therefore, the decode block 22 outputs differential data S(12,1). By shifting the shift register contents again, this time by 5 bits, the register contents become "111001110111 . . . ". When the first 4 bits are checked again, they are found to be "1110", and consequently, the following 8 bits, namely, "01110111" are output as the decode result.

When the contents of the shift register have become completely empty through the processing steps described above (step S8: YES), a control signal indicating this is supplied by the decode block 22 to the address control block 21. Since the code word decoding speed in the decode block 22 is not uniform, the address control block 21 outputs an address for the image information (code word) at a timing which is harmonized with the decode speed. For example, it is supposed that the size of the shift register is 24 bits and the contents of the shift register are "111011111111111011111111". In this case, since 8 bits of image information (original data) "11111111" follow a "1110" header, and are in turn followed by a further "1110" header, the groups of 8 bits "11111111" following the headers should be output as the decode results. Therefore, the shift register contents become empty in two decode operations. On the other hand, if the shift register contents are "101010101010101010101010", then since the bits "10", which are the code word for the differential data S(10,2), are repeated 12 times, a total of 12 decode operations is required.

Since the decode speed in the decode block 22 is non-uniform in this way, the code words are supplied to a shift register within the decode block 22 (step S2), by means of the address control block 21 supplying an address at an appropriate timing. Thereafter, the sequence in step S3—step S8 is repeated in a similar manner. If data is still present in the shift register (step S8: NO), then the sequence returns to step S3. By implementing the processing steps described above, the differential data is supplied successively to the differential processing block 23. In the differential processing block 23, the original image information is obtained by successively adding the differential data. According to the present embodiment as described above, encoding and decoding of image information is performed on the basis of a fixed scheme, and therefore the decode operation can be performed readily by hardware means. In other words, by previously determining the structure of a bifurcating scheme for assigning code words, independently of the image information, it is possible to perform decoding of compressed image information for differing images, by means of the same decoder. Moreover, by limiting the structure of the bifurcating scheme to the order of several levels, and collecting all the differential data to which no code words are assigned under a particular leaf of the aforementioned bifurcating scheme (creating a code word for same by allocating a header and inserting the bits of the differential data after this header), it is possible to restrict the size of the bifurcating scheme to a small size.

Consequently, since the circuit design is simplified, it is possible to conduct encoding of compressed image information at high speed. In current circumstances, as the volume of image information handled in the field of image processing rises with increased CPU processing capacity, high-speed decoding of compressed image information has become an essential element in improving image processing capacity.

As a result of reducing the size of the bifurcating scheme, only a small data volume is required for the table transferred from the ROM, and furthermore, the transfer time is also markedly reduced. For example, in the case of a conventional Haffman encoding technique, if there are 16 types of 8-bit differential data, the table data volume will be 8 bits×16=128 bits, whereas in the present embodiment, only 56 bits are required, and therefore the table data volume can be reduced by 56.25%. The volume of table data increases dramatically, the larger the size of the bifurcating scheme, and therefore restriction of the table data volume contributes greatly to high-speed operation of decoding and simplification of circuit design.

The present example related to a case where an RGB system was adopted for the image information format, but the invention is not limited to this, and a colour palette system may also be adopted. In this case, palette numbers should be allocated to similar colours in a sequential fashion. Moreover, when deriving the differentials in the image information, blocks were constituted in 2-byte units and the differentials between corresponding upper bytes and between corresponding lower bytes were derived, but it is also possible to constitute blocks in 3-byte units and derive differentials between corresponding upper bytes, corresponding middle bytes and corresponding lower bytes. Moreover, the header may be limited to "1110", or it may be "10", or "1100". It is possible to designate a suitable leaf of the bifurcating scheme as the header. Furthermore, the header does not always have to be a code word corresponding to a leaf of a fixed bifurcating scheme, but in this case, the header must be a code word having a combination pattern which cannot be obtained by any of the other code words.

Moreover, the image information to be compressed is not limited to a ROM, and this image information may also be stored in a storage medium such as a flexible disk (FD), hard disk (HD), CD-ROM, CD-R, DVD-ROM, DVD-RAM, DVD-R, PD disk, MD disk , MO disk, or the like. Furthermore, the image information to be decoded is not limited to image information transferred from the aforementioned storage medium installed in or attached to an image processing device, but the data may also be transferred from a host computer via a wired or wireless communications circuit (subscriber circuit, dedicated data line, satellite circuit, or the like). For example, the data may be transferred from a server database by means of the Internet.

Furthermore, the image information encoding and decoding techniques according to the present embodiment are suitable for a video game wherein images displayed on a screen change in real time in accordance with input operations performed by players.

INDUSTRIAL APPLICABILITY

According to the present invention, it is possible to perform decoding of image information by hardware, readily and at high speed, whilst maintaining compression efficiency at similar levels to conventional Haffman encoding techniques. Moreover, since the decoding circuit has a simple design, it is possible to reduce development costs.

What is claimed is:

1. An image information encoding method wherein an appearance frequency of all image information items to be encoded is determined, short code words are allocated from predetermined code words in accordance with leaves of a bifurcating scheme to the image information items having an appearance frequency up to a predetermined ranking, in sequential fashion starting from the image information item having the highest appearance frequency, and a predetermined identifier is appended to a beginning of each of the remaining image information items, resulting in codes being taken as a respective code words allocated to said remaining image information items.

2. The image information encoding method according to claim 1, wherein said bifurcating scheme has a predetermined structure.

3. The image information encoding method according to claim 1 or claim 2, wherein said identifier does not match a combination pattern of any of said code words.

4. The image information encoding method according to any one of claims 1 to 2, wherein the length of the code words allocated to said remaining image information items is uniform.

5. The image information encoding method according to any one of claims 1 to 2, wherein said image information items are differential values of the image information between adjacent picture elements.

6. The image information encoding method according to claim 5, wherein said image information contains color data in RGB format.

7. An image information decoding method, being a method for decoding image information encoded by the method according to any one of claims 1 to 2, wherein, when a beginning of said code word matches said identifier, code following said identifier, being of a code length corresponding to the information volume of said image information items, is decoded as the code word assigned to the image information item which is equivalent to said code, and when the beginning of said code word does not match said identifier, said code word is decoded by referring to a table of code words assigned to each image information item.

8. A computer-readable information storage medium for storing image information encoded by the method according to any one of claims 1 to 2.

9. An image information decoding device, comprising:
first storage means for reading out code words from the information storage medium according to claim 8, in sequential fashion, and storing information temporarily;
second storage means for storing a correspondence table for said code words and corresponding image information items; and
a decoding circuit which, if the beginning of the code word stored in said first storage means matches said identifier, outputs the code following said identifier, being a code having a code length corresponding to an information volume of said image information items, as a decode result, and if the beginning of said code word does not match said identifier, outputs a decode result for said code word by referring to the table stored in said second storing means.

10. An image processing device comprising the image information decoding device according to claim 9.

* * * * *